US 011168978B2

(12) United States Patent
Carcasi et al.

(10) Patent No.: US 11,168,978 B2
(45) Date of Patent: Nov. 9, 2021

(54) HARDWARE IMPROVEMENTS AND METHODS FOR THE ANALYSIS OF A SPINNING REFLECTIVE SUBSTRATES

(71) Applicant: Tokyo Electron Limited, Tokyo (JP)

(72) Inventors: Michael Carcasi, Austin, TX (US); Joshua Hooge, Austin, TX (US)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 17/037,111

(22) Filed: Sep. 29, 2020

(65) Prior Publication Data
US 2021/0207951 A1 Jul. 8, 2021

Related U.S. Application Data

(60) Provisional application No. 62/957,481, filed on Jan. 6, 2020.

(51) Int. Cl.
*G01B 11/06* (2006.01)
*H04N 5/225* (2006.01)
(Continued)

(52) U.S. Cl.
CPC ......... *G01B 11/0691* (2013.01); *G01N 21/55* (2013.01); *H01L 21/6715* (2013.01);
(Continued)

(58) Field of Classification Search
None
See application file for complete search history.

(56) References Cited

U.S. PATENT DOCUMENTS 4,647,172 A * 3/1987 Batchelder ............ G03F 7/3028
396/569
4,851,311 A * 7/1989 Millis .................... G03F 7/3028
430/30
(Continued)

FOREIGN PATENT DOCUMENTS

JP        09276775 A  * 10/1997
JP     2009094208 A     4/2009
(Continued)

OTHER PUBLICATIONS

Korean Intellectual Property Office, The International Search Report and the Written Opinion for International application No. PCT/US2020/053372, dated Jan. 15, 2021, 10 pg.

*Primary Examiner* — Stefan Gadomski
(74) *Attorney, Agent, or Firm* — Slater Matsil, LLP

(57) ABSTRACT

Embodiments of systems and methods for monitoring one or more characteristics of a substrate are disclosed. Various embodiments of utilizing optical sensors (in one embodiment a camera) to provide data regarding characteristics of a fluid dispensed upon the substrate are described. A variety of hardware improvements and methods are provided to improve the collection and analysis of the sensor data. More specifically, a wide variety of hardware related techniques may be utilized, either in combination or singularly, to improve the collection of data using the optical sensor. These hardware techniques may include improvements to the light source, improvements to the optical sensors, the relationship of the physical orientation of the light source to the optical sensor, the selection of certain pixels of the image for analysis, and the relationship of the optical sensor frame rate with the rotational speed of the substrate.

20 Claims, 12 Drawing Sheets

(51) Int. Cl.
  *H04N 7/18*    (2006.01)
  *G01N 21/55*   (2014.01)
  *H01L 21/67*   (2006.01)
  *H01L 21/66*   (2006.01)

(52) U.S. Cl.
  CPC ........ *H01L 21/67253* (2013.01); *H01L 22/12* (2013.01); *H04N 5/2256* (2013.01); *H04N 7/18* (2013.01)

(56) References Cited

U.S. PATENT DOCUMENTS

| | | | | |
|---|---|---|---|---|
| 5,089,305 A * | 2/1992 | Ushijima | ................ | B05B 15/55 427/422 |
| 5,094,884 A * | 3/1992 | Hillman | ................ | G03F 7/162 430/272.1 |
| 5,127,362 A * | 7/1992 | Iwatsu | ................ | B05B 12/12 118/667 |
| 5,366,757 A * | 11/1994 | Lin | ................ | G03F 7/162 118/52 |
| 5,939,130 A * | 8/1999 | Shiraishi | ................ | G03F 7/162 427/9 |
| 5,985,357 A * | 11/1999 | Sanada | ................ | G03F 7/162 427/8 |
| 6,248,175 B1 * | 6/2001 | Subramanian | ........ | G03F 7/3021 118/300 |
| 6,319,317 B1 * | 11/2001 | Takamori | ................ | G03F 7/162 118/52 |
| 6,376,013 B1 * | 4/2002 | Rangarajan | ............ | B05C 11/02 118/319 |
| 6,383,948 B1 * | 5/2002 | Kitano | ................ | H01L 21/6715 438/758 |
| 6,493,078 B1 | 12/2002 | Fitzsimmons | | |
| 6,642,155 B1 * | 11/2003 | Whitman | ............ | H01L 21/6715 427/595 |
| 6,680,078 B2 | 1/2004 | Davlin | | |
| 6,693,708 B1 | 2/2004 | Hunter | | |
| 6,707,545 B1 | 3/2004 | Hunter | | |
| 6,721,045 B1 | 4/2004 | Hunter | | |
| 6,818,064 B2 | 11/2004 | Baker | | |
| 6,849,563 B2 * | 2/2005 | Barth | .................... | H01L 21/316 438/782 |
| 6,869,640 B2 * | 3/2005 | Yoshihara | ............... | G03F 7/162 427/240 |
| 6,913,781 B2 * | 7/2005 | Kaneyama | .............. | G03F 7/162 118/52 |
| 6,982,002 B2 * | 1/2006 | Tanaka | ................ | H01L 21/6715 118/320 |
| 7,012,684 B1 | 3/2006 | Hunter | | |
| 7,485,188 B2 * | 2/2009 | Takekuma | ........ | H01L 21/67253 118/683 |
| 7,497,026 B2 * | 3/2009 | Herchen | ................ | G01D 5/342 250/492.2 |
| 7,670,643 B2 | 3/2010 | Winter | | |
| 9,555,436 B2 * | 1/2017 | Uemae | ............... | H01L 21/6715 |
| 10,665,481 B2 * | 5/2020 | Sano | ............... | H01L 21/67051 |
| 2002/0176928 A1 * | 11/2002 | Minami | ............ | H01L 21/67253 427/8 |
| 2014/0045281 A1 * | 2/2014 | Ura | ................... | H01L 21/68792 438/16 |
| 2019/0172737 A1 * | 6/2019 | Endo | ..................... | G01N 21/94 |
| 2019/0217325 A1 | 7/2019 | Devilliers | | |
| 2019/0217326 A1 | 7/2019 | Devilliers | | |
| 2019/0287793 A1 | 9/2019 | Devilliers | | |

FOREIGN PATENT DOCUMENTS

| | | |
|---|---|---|
| JP | 6000743 B2 | 10/2016 |
| KR | 101107507 B1 | 1/2012 |
| KR | 101842119 B1 | 3/2018 |
| KR | 101977771 B1 | 5/2019 |
| WO | 3229390 W | 4/2002 |

* cited by examiner

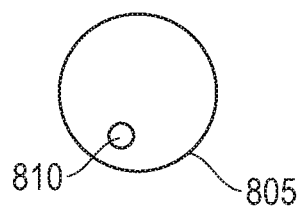 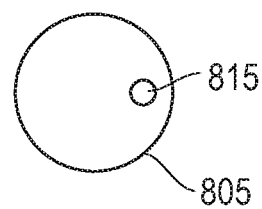 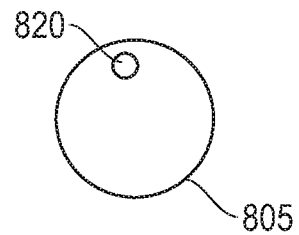
*FIG. 8A*     *FIG. 8B*     *FIG. 8C*
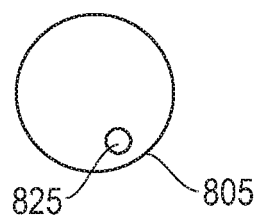 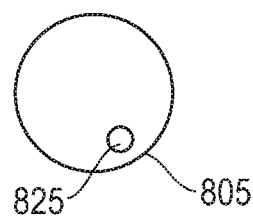 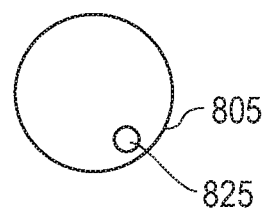
*FIG. 9A*     *FIG. 9B*     *FIG. 9C*

HARDWARE IMPROVEMENTS AND METHODS FOR THE ANALYSIS OF A SPINNING REFLECTIVE SUBSTRATES

This application claims priority to U.S. Provisional Patent Application No. 62/957,481, entitled, "Hardware Improvements and Methods for the Analysis of Spinning Reflective Substrates," filed Jan. 6, 2020; the disclosure of which is expressly incorporated herein, in its entirety, by reference.

BACKGROUND

The present disclosure relates to the processing of substrates. In particular, it provides a novel system and method for monitoring one or more characteristics of a substrate processing step. In one embodiment, the system and method disclosed herein may be utilized when processing semiconductor substrates.

Traditional substrate processing systems utilize photolithography processes, which include photoresist coating, exposure, photoresist develop, and various bake steps. The materials and processes utilized in these steps may all impact film thickness, critical dimension targeting, line roughness, uniformity, etc. on a substrate. As geometries in substrate processing continue to shrink, the technical challenges to forming structures on substrates increase. These processes utilize fluid dispense systems at various photolithography process steps. Fluid dispense systems may also be utilized to apply fluids and/or form coatings at other process steps in a substrate processing flow.

Gross processing equipment excursions or faults such as equipment breakdowns, material drips, improper arm movements, etc. in fluid dispense systems are known to be monitored. One approach for monitoring gross processing issues in coating modules has been the inclusion of a camera in a coating module of a processing system. For example, coating modules have included spin module monitor (SMM) cameras which can be used to identify drips of the material being coated, improper dispense arm movements, etc. Images from the SMM camera may be analyzed after processing to determine if a substrate was subjected to such process excursions or faults.

SUMMARY

Various embodiments of systems and methods for monitoring one or more characteristics of a substrate are disclosed herein. More specifically, the present disclosure provides various embodiments of utilizing optical sensors to provide information regarding characteristics of a fluid dispense system. In one embodiment, the optical sensor may be a camera used for obtaining video images and/or still images from the substrate. However, the optical sensor may be any type of other optical sensors that obtain spectral data, for a given wavelength or range of wavelengths, from a substrate. For example, other optical sensors suitable for use within the fluid dispense system disclosed herein include, but are not limited to, spectrometers and sensors of laser-based transceivers. Thus, though described herein with regard to one embodiment of an optical sensor which is a camera, it will be recognized that the techniques described herein are also applicable to other optical sensors and not limited to cameras. Thus, the use of a camera as the sensor in the embodiments discussed below is merely exemplary and non-limiting. The optical sensors may be utilized to collect video images, still images, spectrophotometric signals, optical power signals, etc.

As disclosed herein, a variety of hardware improvements and methods are provided to improve the collection and analysis of the optical sensor data. More specifically, as described below, a wide variety of hardware related techniques may be utilized, either in combination or singularly, to improve the collection of data using the optical sensor system (for example a camera). These hardware techniques may include improvements to the light source, improvements to the sensors of the optical sensor, the relationship of the physical orientation of the light source to the optical sensor, the selection of certain pixels of the image for analysis, and the relationship of the optical sensor frame rate with the rotational speed of the substrate. These hardware improvements may provide improved film thickness measurement capabilities and reduce signal noise in the data.

In a first embodiment, the light source may be chose so as to supply longer wavelengths of light to assist in minimizing multiple wavelengths simultaneously having interference effects. Specifically, the light source may be chosen to have wavelengths near the absorption capabilities/limitation of the optical sensor (on the high wavelength side). This provides benefits from an increase in signal to noise as the nature of the periods of constructive and destructive interference has increased which means it is less likely to have the situation of the greatest common multiple creating thicknesses in which multiple wavelengths from the light source having interference simultaneously.

In one alternative of the first embodiment, a method of monitoring one or more characteristics of a fluid dispense system is provided. The method may comprise providing a substrate within the fluid dispense system; providing an optical sensor, the optical sensor having an optical range of detected wavelengths; providing a light source, the light source providing wavelengths in only an upper 50 percent of the optical range; and obtaining data from the optical sensor to monitor a condition of a fluid dispensed on the substrate.

In another alternative of the first embodiment, a fluid dispense system for coating a film on a substrate is provided. The fluid dispense system may comprise a chuck capable of holding the substrate; a nozzle capable of dispensing one or more fluids onto the substrate; an optical sensor, the optical sensor having an optical range of detected wavelengths; a light source, the light source providing wavelengths in only an upper 50 percent of the optical range; and a controller coupled to the optical sensor, the controller configured to receive data from the optical sensor regarding light reflected from the substrate when the one or more fluids are dispensed on the substrate.

In the alternatives of the first embodiment, the optical sensor may be a camera. In some alternatives, the light source provides wavelengths in only an upper 20 percent of the optical range.

In a second embodiment, the optical sensor and the light source may be co-optimized by configuring the optical sensor so as not to exclude (such as exclusion by a filter) the higher wavelengths provided by the light source. In one embodiment, a CMOS (complementary metal oxide semiconductor)/charged coupled device (CCD) camera without the presence of a filter is utilized. In one embodiment, the light source and camera combination may operate in the near-infrared (NIR) and/or shortwave-infrared (SWIR) spectrums.

In one alternative of the second embodiment, a method of monitoring one or more characteristics of a fluid dispense system is provided. The method may comprise providing a substrate within the fluid dispense system; providing a camera, the camera configured to receive wavelengths of light in the near infrared spectrum or higher; providing a light source, the light source providing wavelengths in the near infrared spectrum or higher; and obtaining data from the camera at wavelengths in the near infrared spectrum or higher to monitor a condition of a fluid dispensed on the substrate.

In another alternative of the second embodiment, a fluid dispense system for coating a film on a substrate is provided. The fluid dispense system may comprise a chuck capable of holding the substrate; a nozzle capable of dispensing one or more fluids onto the substrate; a camera, the camera configured to receive wavelengths of light in the near infrared spectrum or higher; a light source, the light source providing wavelengths in the near infrared spectrum or higher; and a controller coupled to the camera, the controller configured to receive data from the camera regarding light reflected from the substrate when the one or more fluids are dispensed on the substrate.

In the alternatives of the second embodiment, the camera may be a CMOS camera or a CCD camera. Further, the light source may provide wavelengths in a short wavelength infrared spectrum or higher. The camera may be an Indium Gallium Arsenide based camera.

In a third embodiment, filtering may be utilized to limit instances in which multiple wavelengths interfere simultaneously. Specifically, optical filters may be provided in the optical light path between the light source and the optical sensor to reduce the spectral range of the utilized light. Moreover, multiple filters may be provided in the system so that the amount of filtering may be selectively changed. Changes to the filtering may be dependent upon the materials being coated and/or the underlying substrate materials.

In one alternative of the third embodiment a method of monitoring one or more characteristics of a fluid dispense system is provided. The method may comprise providing a substrate within the fluid dispense system; providing a light source having a spectral range of wavelengths; providing an optical sensor, the optical sensor receiving light from the light source that is reflected off the substrate; providing a filter in an optical light path between the light source and the optical sensor; the filter narrowing a received spectral range of light received by the optical sensor; and obtaining data from the optical sensor to monitor a condition of a fluid dispensed on the substrate.

In another alternative of the third embodiment, a fluid dispense system for coating a film on a substrate is provided. The fluid dispense system may comprise a chuck capable of holding the substrate; a nozzle capable of dispensing one or more fluids onto the substrate; an optical sensor; a light source, an optical light path between the light source and the optical sensor so that the optical sensor may receive light from the light source that is reflected off the substrate; a filter in the optical light path between the light source and the optical sensor, the filter narrowing a received spectral range of light received by the optical sensor; and a controller coupled to the optical sensor, the controller configured to receive data from the optical sensor regarding light reflected from the substrate when the one or more fluids are dispensed on the substrate.

In the alternatives of the third embodiment, the optical sensor may be a camera. Further, the filter may be located in a portion of the optical light path between the substrate and the camera. In addition, the fluid dispense system may comprise a plurality of filters, the filters being capable of being selectably placed in the optical light path so as to change the received spectral range of light received by the camera. In some embodiments. The selection of one or more of the plurality of filters is based upon a fluid being dispensed and/or a material of the substrate.

In a fourth embodiment, the orientation and physical relationship of the light source and optical sensor may be controlled. Specifically, the light source and the optical sensor may be arranged so that one of more the following conditions exist: 1) maintaining a similar angle to a reference plane (that is parallel to the substrate plane) of the light source and the optical sensor, 2) maintaining a similar distance relationship of the light source to the center of substrate and the center of substrate to optical sensor and 3) having the optical sensor positioned 180 degrees diagonally across from light source. Such conditions help ensure the $0^{th}$ order reflection of light from the substrate is obtained and minimize light diffraction effects which may be caused by the underlying substrate.

In one alternative of the fourth embodiment a method of monitoring one or more characteristics of a fluid dispense system is provided. The method may comprise providing a substrate within the fluid dispense system; providing a light source; providing an optical sensor, the optical sensor receiving light from the light source that is reflected off the substrate; arranging a physical location of the optical sensor and the light source so that a $0^{th}$ order reflection of the light that is reflected off the substrate is received by the optical sensor; and obtaining data from the optical sensor to monitor a condition of a fluid dispensed on the substrate.

In another alternative of the fourth embodiment, a fluid dispense system for coating a film on a substrate is provided. The fluid dispense system may comprise a chuck capable of holding the substrate; a nozzle capable of dispensing one or more fluids onto the substrate; an optical sensor; a light source, an optical light path between the light source and the optical sensor so that the optical sensor may receive light from the light source that is reflected off the substrate, the optical sensor and the light source physically located so that the optical light path includes $0^{th}$ order reflection at the optical sensor of the light that is reflected off the substrate; and a controller coupled to the optical sensor, the controller configured to receive data from the optical sensor regarding light reflected from the substrate when the one or more fluids are dispensed on the substrate.

In alternatives of the fourth embodiment, the optical sensor may be a camera. In some embodiments, an angle of incidence of the light from the light source that is provided to the substrate and an angle of incidence of the light reflected from the substrate that is provided to the camera is approximately the same. Further, in some embodiments, the light source and the camera are located approximately an equidistance from a center of the substrate. In some embodiments, the light source and the camera are located in the fluid dispense system so as to be diagonally located from each other with reference to the substrate.

In a fifth embodiment, rather than using all pixels reflected from a substrate, only a subset of pixels is utilized for data processing. The subset of pixels may be chosen so as to minimize sources of image noise and also exclude non $0^{th}$ order reflections. This may be accomplished by limiting the selected pixels to those pixels in close proximity to the observable primary reflection of the light source.

In one alternative of the fifth embodiment a method of monitoring one or more characteristics of a fluid dispense system is provided. The method may comprise providing a substrate within the fluid dispense system; providing a light source; providing a camera, the camera receiving light from the light source that is reflected off the substrate; and coupling a controller to the camera, the controller configured to receive data from the camera regarding light reflected from the substrate when one or more fluids are dispensed on the substrate, the controller processing the data so as to selectively consider only a subset of pixels of the data from the camera to monitor a condition of a fluid dispensed on the substrate.

In some alternatives of the fifth embodiment the use of only a subset of pixels of the data provides an output having less noise than if all available pixels are used. Further the subset of pixels selected includes the $0^{th}$ order reflection of light reflected off the substrate.

In a sixth embodiment, a sampling rate of the optical sensor is synchronized to match the substrate rotational speed. Such synchronization allows for each sample to be obtained from the same area of the substrate. By performing this synchronization, diffraction effects which may result from obtaining samples from differing areas of the substrate may be minimized.

In one alternative of the sixth embodiment, a method of monitoring one or more characteristics of a fluid dispense system is provided. The method may comprise providing a chuck within the fluid dispense system, the chuck being configured to spin; providing a substrate within the fluid dispense system; spinning the chuck at a first revolutions per minute; providing a light source; providing an optical sensor, the optical sensor receiving light from the light source that is reflected off the substrate, the optical sensor sampling received light at a first sampling rate; synchronizing the first revolutions per minute to the first sampling rate; and obtaining data from the optical sensor to monitor a condition of a fluid dispensed on the substrate.

In another alternative of the sixth embodiment, a fluid dispense system for coating a film on a substrate is provided. The fluid dispense system may comprise a spin chuck capable of holding the substrate; a nozzle capable of dispensing one or more fluids onto the substrate; an optical sensor; and a light source; one or more controllers coupled to the optical sensor and the spin chuck, the one or more controllers configured to synchronize a rate of spinning of the spin chuck to a sampling rate of the optical sensor. The at least one of the one or more controllers is configured to receive data from the optical sensor regarding light reflected from the substrate when the one or more fluids are dispensed on the substrate.

In some alternatives of the sixth embodiment, the optical sensor is a camera. In some embodiments the synchronizing of the first revolutions per minute (or the rate of spinning of the spin chuck) to the first sampling rate provides for a plurality of frames of data to be collected by the camera so that the substrate is in a same rotational orientation for each of the plurality of frames.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

FIGS. 8A-8C illustrate the pixel locations analyzed in differing frames when the camera frame rate is not synchronized to the substrate spin speed.

FIGS. 9A-9C illustrate the pixel locations analyzed in differing frames when the camera frame rate is synchronized to the substrate spin speed.

DETAILED DESCRIPTION

The techniques described herein may be utilized within a wide variety of fluid dispense systems. For example, an exemplary fluid dispense system may be utilized for various fluid dispense purposes (such as, for example, a resist coating unit, a resist developing unit, or other spin coating units) within which fluid are applied to a substrate for processing purposes. It is recognized that the fluid dispense systems shown herein are merely exemplary embodiments of a processing system within which the monitoring techniques described herein may be applied. Thus, the techniques disclosed herein may be applied to other fluid dispense systems and/or other processing units. Moreover, these fluid dispense systems may be stand-alone units or more be integrated in a larger systems. For example, the fluid dispense systems described herein may be integrated within larger systems that include coating, developing, baking, inspection, exposure, etc. modules.

Figure 1:
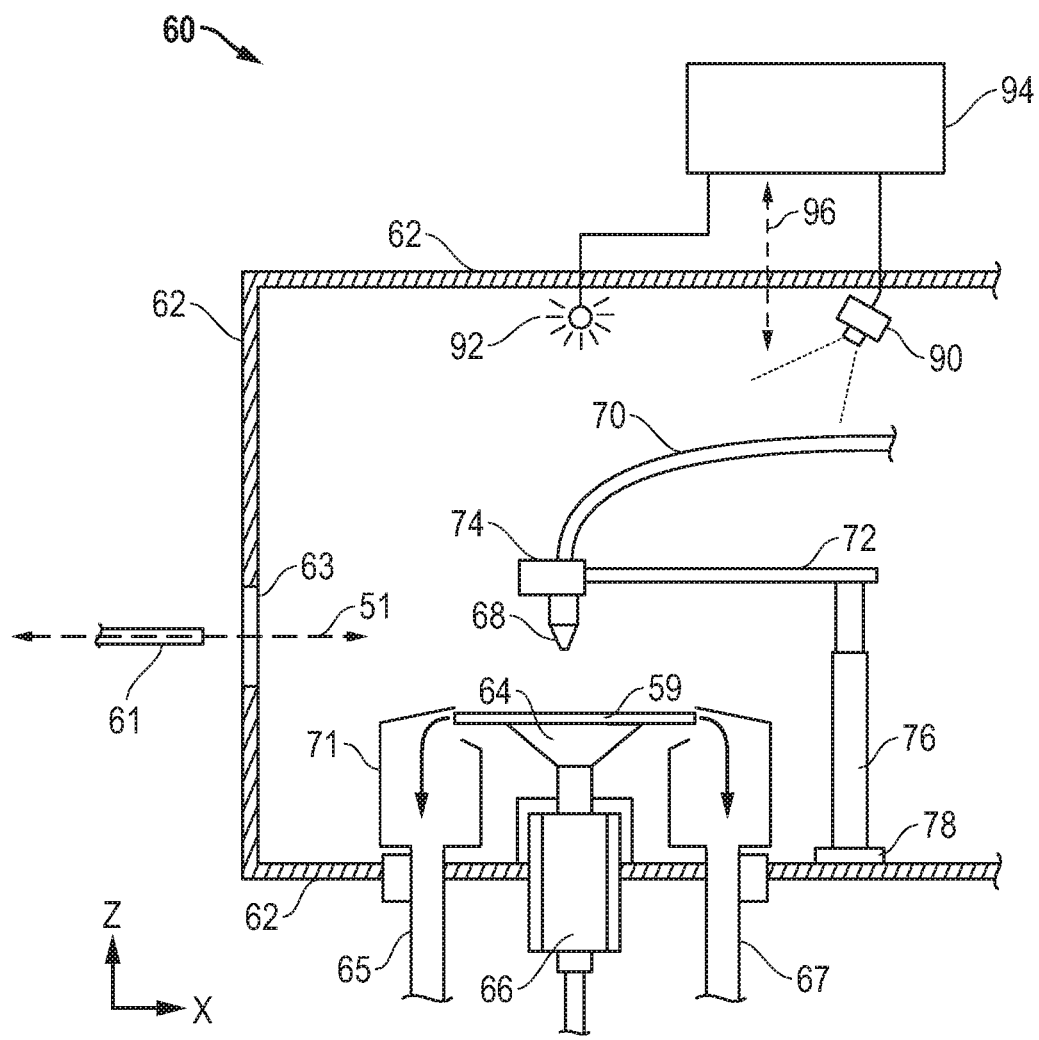
FIG. 1 is an exemplary fluid dispense system.

The fluid dispense systems described herein may be utilized to subject substrates to a wide variety of processing liquids, which may be part of, for example, resist coating unit, a developing unit or other fluid dispense systems (such as for example, spin-on hard mask units, spin-on antireflective coating units, etc.). As shown in FIG. 1, a fluid dispense system 60 includes a processing chamber, which is bounded by a chamber walls 62. A spin chuck 64 disposed inside chamber walls 62 provides support for a substrate, which may in some embodiments, be a semiconductor wafer (W). More specifically, the spin chuck 64 has a horizontal upper surface on which the substrate is supported during processing. A suction port (not shown) may be provided in the horizontal upper surface of spin chuck 64 for securing the substrate to the spin chuck with suction. The spin chuck 64, and the substrate supported by the spin chuck 64, may be rotated at a variable angular velocity by a drive mechanism 66, which may be a stepper motor, etc. The drive mechanism 66 may operate at various angular velocities for the application of the liquid material and flow of the liquid material onto the substrate.

A nozzle 68 is adapted to dispense one or more liquid solutions onto the substrate at a specified rate to apply one or more layers or films onto an upper surface of the substrate. Typical layers or films that may be applied to the substrate surface include, but are not limited to, imaging layers (e.g., photoresist), develop solutions, topcoat (TC) barrier layers, topcoat antireflective (TARC) layers, bottom antireflective (BARC) layers, sacrificial and barrier layers (hard mask) for etch stopping, etc. The nozzle 68 is coupled to a liquid supply unit (not shown) through a liquid supply line 70. In some embodiments, nozzle 68 may be attached to the leading end of a nozzle scan arm 72 through a nozzle holder 74. The nozzle scan arm 72 is mounted at the upper end portion of a vertical support member 76 that is horizontally movable on a guide rail 78 in one direction (e.g., in the Y-direction). Although not shown in the figure, a drive mechanism (not shown) may be coupled to the nozzle scan arm 72, the vertical support member 76 or the guide rail 78 to move the nozzle 68 in the Y-direction. Other mechanisms (also not shown) can be used to move the nozzle 68 in the Z-direction and/or in the X-direction. It will be recognized that the particular dispense and arm mechanisms and movements described herein are merely exemplary as a wide variety of dispense techniques are well known in the art.

A cup 71 is provided to capture and collect a majority of the liquid material ejected from the substrate by centrifugal forces generated during rotation by the spin chuck 64. The spin chuck 64 supports and rotates (i.e., spins) the substrate about its central normal axis relative to the cup 71, which is stationary. Liquid material ejected from the substrate 59 and collected by the cup 71 is drained via a drain line 65 and drain unit (not shown). In some embodiments, an exhaust line 67 and exhaust unit (not shown), such as a vacuum pump or other negative pressure-generating device may also be used to remove gaseous species (including but not limited to vapors released from substrate layers during processing) from the processing space inside the cup 71.

Spin chuck 64 and drive mechanism 66 are disposed within an opening in the cup 71. In some embodiments, an elevation mechanism, such as an air cylinder and an up-and-down guide unit, may be provided within drive mechanism 66 so the spin chuck 64 may move vertically relative to the chamber walls 62. The substrate can be delivered to the spin chuck 64 by a processing arm 61 through a loading/unloading opening 63 of fluid dispense system 60 in a direction 51 as shown in FIG. 1. The processing arm 61 may form a part of the fluid dispense system 60 or may be part of a separate substrate transfer mechanism (not shown) for interacting with other process equipment. In some embodiments, the processing arm 61 may be included within the main arm mechanism of a larger system for transferring substrates between various process modules of the larger system. In other embodiments, the processing arm 61 may be included within other substrate processing systems. In some embodiments, the elevation mechanism can lift the drive mechanism 66 and/or the spin chuck 64 upwards to receive a substrate. Alternatively, the cup 71 may be configured to move up-and-down, or may be configured to separate and widen, to allow a substrate to be placed on the spin chuck 64.

It is noted that the fluid dispense system 60 shown in FIG. 1 is merely one example processing system in which the monitoring techniques described herein may be used. Thus, the fluid dispense system 60 is not meant to be limiting, but rather merely representative of one example processing system within which the monitoring techniques described herein may be utilized. Further, though the fluid dispense system 60 is described with reference to a system for processing substrates, which may in some embodiments be semiconductor wafers, it will be recognized that the techniques described herein may be utilized when processing other types of substrates. Thus, it will be recognized that the monitoring techniques described herein may be utilized within a wide range of substrate processing systems that apply liquid solutions to substrates.

Various embodiments of systems and methods for monitoring one or more characteristics of a substrate are disclosed herein. More specifically, the present disclosure provides various embodiments of utilizing optical sensors to provide information regarding characteristics of a fluid dispense system. In one embodiment, the optical sensors may be camera systems for obtaining video and/or still images from the substrate. However, the optical sensors may also include other optical sensors that obtain spectral data, for a given wavelength or range of wavelengths, from a substrate. For example, other optical sensors suitable for use within the substrate inspection system disclosed herein include, but are not limited to, spectrometers and sensors of laser-based transceivers. Thus, though described herein with regard to one embodiment of an optical sensor which is a camera, it will be recognized that the techniques described herein are equally applicable to other optical sensors and not limited to cameras. Thus, the use of a camera as the sensor in the embodiments discussed below is merely exemplary and non-limiting. The optical sensors may be utilized to collect video images, still images, spectrophotometric signals, optical power signals, etc.

As disclosed herein, a variety of hardware improvements and methods are provided to improve the collection and analysis of the optical sensor data. More specifically, as described below, a wide variety of hardware related techniques may be utilized, either in combination or singularly, to improve the collection of data using the optical sensor system (for example a camera). These hardware techniques may include improvements to the light source, improvements to the sensors of the optical sensor, the relationship of the physical orientation of the light source to the optical sensor, the selection of certain pixels of the image for analysis, and the relationship of the optical sensor frame rate with the rotational speed of the substrate. These hardware improvements may provide improved film thickness measurement capabilities and reduce signal noise in the data.

Figure 2:
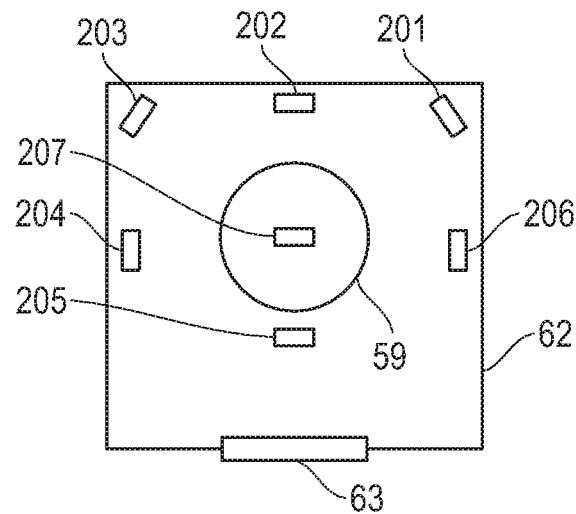
FIG. 2 illustrates exemplary camera locations for the fluid dispense system of FIG. 1.
Figure 3:
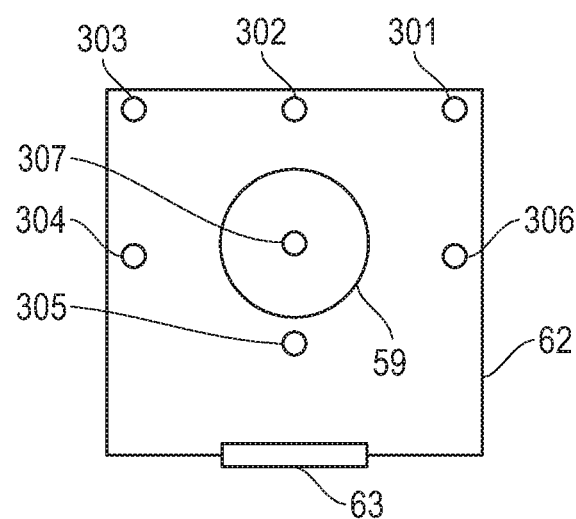
FIG. 3 illustrates exemplary light locations for the fluid dispense system of FIG. 1.

Thus, the fluid dispense system 60 also includes a light source 92 and an optical sensor. In the embodiment of the figures the optical sensor is a camera 90 as shown in FIG. 1. As mentioned though, it will be recognized that the use of a camera is merely an exemplary embodiment of any of a wide variety of optical sensors and is not meant to limit the optical sensor to a camera embodiment. Further, as used herein, "camera" may refer to simply a camera or may be a more complex system that includes a camera and other electronics. The camera 90 may be utilized to monitor the fluid dispense and coating process as described in more detail herein below. The locations of the light source 92 and camera 90 shown in FIG. 1 are merely exemplary and a wide variety of other positions may equally be utilized to allow the camera 90 to monitor the condition of the substrate surface. FIGS. 2 and 3 provide a simplified top view (excluding many of the details of FIG. 1) of the fluid dispense system 60 so as to better illustrate exemplary locations of the camera 90 and light source 92. It will be recognized, however, that these locations are merely exemplary and other locations may be utilized. As shown in FIGS. 2 and 3 the substrate 59 is provided within the chamber walls 62 of the processing chamber which has a loading/unloading opening 63. FIG. 2 illustrates exemplary locations for locating the camera 90 in the upper regions of the process chamber above the substrate. More specifically, FIG. 2 illustrates exemplary camera locations 201, 202, 203, 204, 205, 206, and 207 for locating the camera 90. FIG. 3 illustrates exemplary locations for locating the light source 92 in the upper regions of the process chamber above the substrate. More specifically, FIG. 3 illustrates exemplary light source locations 301, 302, 303, 304, 305, 306 and 307 for locating the light source 92. Again it will be recognized that such locations of the camera and light source are merely exemplary and other locations may be utilized.

The techniques described herein are not limited to a particular camera and light source type. The camera may be any of wide variety of types of cameras designed to capture and/or store data from an image. The cameras may collect still images and/or video images. A wide variety of cameras may be utilized, including but not limited to, charged coupled device (CCD) image sensor cameras, complementary metal oxide semiconductor (CMOS) image sensor cameras, N-type metal-oxide-semiconductor (NMOS) image sensor cameras, indium gallium arsenide (InGaAs) image sensor cameras, indium antimony (InSb) image sensor cameras, etc. In some examples, the light source may be ambient light, a light emitting diode (LED) light source, or a laser light source. In some embodiments, the light source may typically be a light source of the visible spectrum or longer. For example, light sources in the visible spectrum, near-infrared (NIR), shortwave-infrared (SWIR) and mid-infrared (MIR) are exemplary light sources. In one embodiment, an amber light source in the visible spectrum may be utilized. In another embodiment, an infrared (IR) light source is utilized. In yet other embodiments, a multi-spectrum light source may be utilized. It will be recognized that many cameras may include integrated filters that block the IR spectrum. The use of such filters may be undesirable if the IR spectrum is desired for analysis.

As mentioned above, monitoring of a wide range of variables and conditions of the fluid dispense process may be achieved through the utilization of an optical sensor in the fluid dispense system. Various monitoring techniques are described below. It will be recognized that these techniques need not be utilized together but rather may be utilized individually. Alternatively, some or all of the techniques may be combined for more thorough monitoring.

Coupled to (or even part of) the fluid dispense system 60 as shown of FIG. 1 may be a controller 94 for setting and controller various process operation parameters of the system. The controller 94 may be coupled to the camera 90 and light source 92 as shown. The controller 94 may also be coupled as indicated by signal line 96 to any or all of a number of the components of the fluid dispense system 60 to receive information from and/or to control the components. For example the controller 94 may receive information from and provide control information to the camera 90, processing arm 61, spin chuck 64, drive mechanism 66, nozzle 68, nozzle scan arm 72, etc. The controller 94 may also be generally configured to analyze various data collected by the fluid dispense system, and in some cases provide feedback control to various process operation parameters. Thus, the techniques for data processing and system control described herein may be implemented by a controller 94. It is noted that the controller(s) 94 described herein can be implemented in a wide variety of manners. In one example, the controller may be a computer. In another example, controller 94 may include one or more programmable integrated circuits that are programmed to provide the functionality described herein. For example, one or more processors (e.g., microprocessor, microcontroller, central processing unit, etc.), programmable logic devices (e.g., complex programmable logic device (CPLD)), field programmable gate array (FPGA), etc.), and/or other programmable integrated circuits can be programmed with software or other programming instructions to implement the functionality described herein for controller 94. It is further noted that the software or other programming instructions can be stored in one or more non-transitory computer-readable mediums (e.g., memory storage devices, flash memory, dynamic random access memory (DRAM), reprogrammable storage devices, hard drives, floppy disks, DVDs, CD-ROMs, etc.), and the software or other programming instructions when executed by the programmable integrated circuits cause the programmable integrated circuits to perform the processes, functions, and/or capabilities described herein. Other variations could also be implemented. It is noted that though the controller 94 is shown as part of the fluid dispense system 60, in alternate embodiments, the controller 94 may be separate from the fluid dispense system 60.

The analysis of a fluid dispense process with a camera may include a wide range of techniques of analyzing and processing the images obtained of the fluid dispense process. Such techniques may include analyzing still images and/or analyzing video images obtained from the camera. The monitoring of fluid dispense processes and the image obtained may be utilized for real time analysis/control and/or post process analysis. This image analysis may provide hardware and process feedback that may otherwise not be available and can lead to improvements and optimization. Image recording is an efficient method of data collection that can be done for every substrate. The image analysis can be used to determine and/or control a variety of variables including film thicknesses, critical dimensions, film uniformity, etc. In order to efficiently and accurately analyze images collected, automated techniques may be desirable.

The hardware utilized to monitor a spin coating process may be optimized in a wider variety of manners so as to provide more accurate information regarding the film formed on a substrate. More specifically, as described below, a wide variety of hardware related techniques may be utilized, either in combination or singularly, to improve the collection of data using the camera system. These hardware techniques may include improvements to the light source 92, improvements to the sensors of the camera 90, the relationship of the physical orientation of the light source 92 to the camera 90, the selection of certain pixels of the image for analysis, and the relationship of the camera frame rate with the rotational speed of the substrate.

Optimization of the hardware may address a variety of issues that arise when using an optical sensor during a spin coating process. In a spin coating process, it is possible to visually observe color changes on the wafer as the coated film decreases to its final coat thickness. These color changes are due to thin film interference reflectivity effects. For example when coating a resist layer on a substrate, these thin film interference reflectivity effects are the effects of the resist/air reflected light wave with the resist/substrate reflected light wave. As interference of different wavelengths happen at different film thicknesses, one may use the changing of the wavelength (and thus the color) that is having interference effect to monitor film thickness changes.

Figure 4:
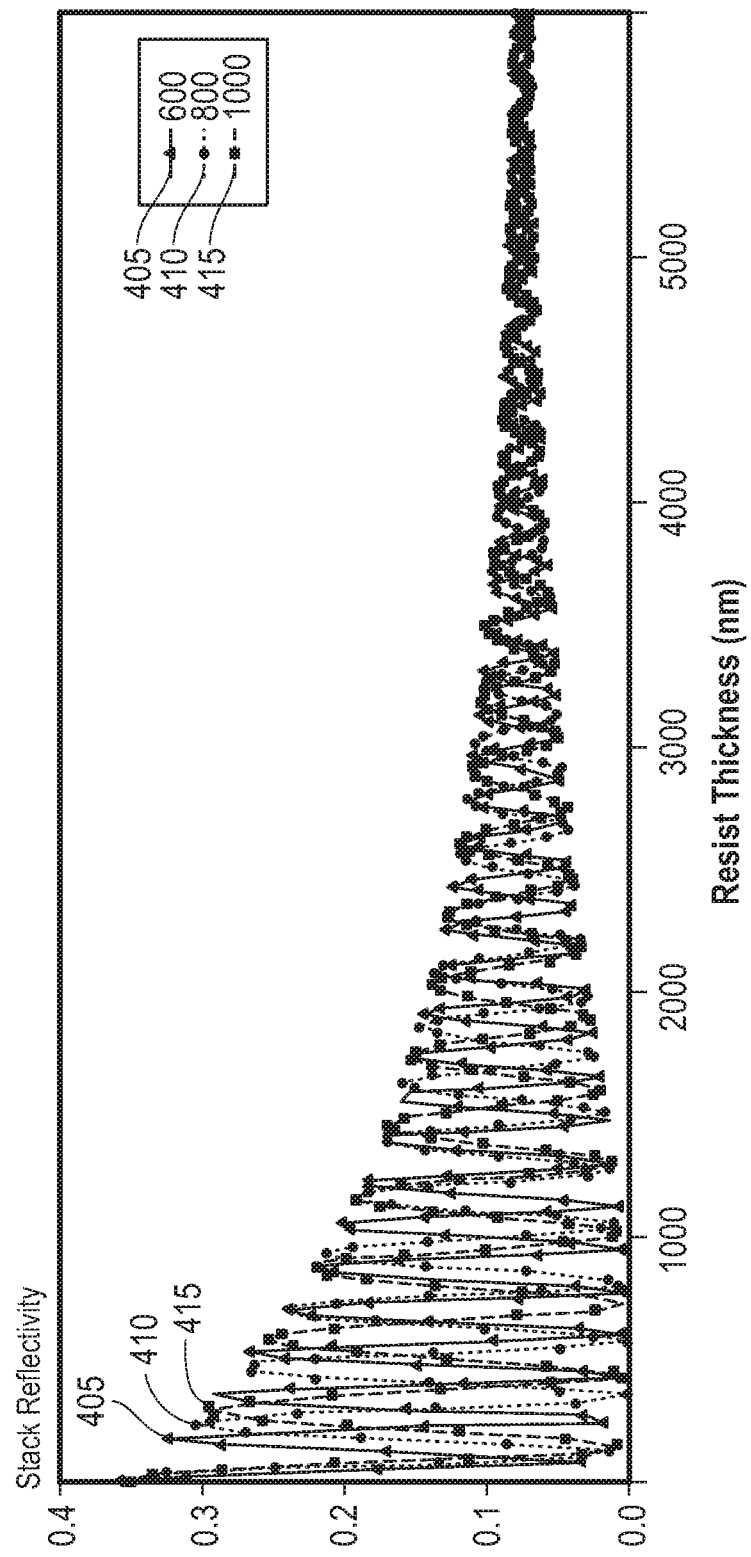
FIG. 4 illustrates a plot of reflectivity versus resist thickness for wavelength assumptions.

For example, FIG. 4 illustrates the impact on reflectivity as a film thins during spinning. Note, in FIG. 4 the x axis represents resist thickness and the y axis illustrates the stack reflectivity. As shown in FIG. 4, reflectivity changes for three different exemplary processes having three different wavelength assumptions are illustrated. More specifically, plot 405, plot 410 and plot 415 illustrate different center wavelengths assumptions for a Gaussian distribution light source assumption in simulation. In simulation, the reflectivity at a given film thickness assumption is determined.

Depending upon the film thicknesses involved and the underlying substrate conditions and materials, however, detection, discernment, analysis, and correlation of the reflected signal may be difficult. For example, for a typical resist/substrate refractive index relationship, an optical path length thru the resist film that is a half multiple of the wavelength of the light divided by the refractive index of the material will have constructive interference with the same wavelength of light that is reflected off of the air/material surface and will have destructive interference with that same light if the optical path length is a quarter multiple of the wavelength of light divided by the refractive index of the material. As material decrease thickness, the wavelength(s) of light that will constructively interfere change and thus results in an oscillation of the visible spectrum color (or intensity) seen by an observing camera (or sensor). For some LED light sources, that can have a significant spectral range, if means however that there are situations in which a greatest common multiple thickness relationship happens between two distantly different wavelengths having constructive interference simultaneously which mixes the color response seen by the camera and leads to loss of signal.

First Embodiment

Light Source Optimization

In a first embodiment, light source wavelength may be optimized to address some of the problems discussed above. Specifically, longer wavelengths of light will assist with preventing multiple wavelengths simultaneously having constructive interference effects (effects which induce more noise in the thin film interference results). Thus, for the same spectral range, for example, the light source may be chosen to be near the absorption capabilities/limitation of the optical sensor (on the high wavelength side). This provides benefits from an increase in signal to noise as the nature of the periods of constructive and destructive interference has increased which means it is less likely to have the situation of the greatest common multiple creating thicknesses in which multiple wavelengths from the light source are having interference simultaneously. For example in one illustrative embodiment, a camera having optical sensing capabilities of sensing wavelengths of a range of 400 nm to 850 nm (or approximately 1050 nm if no IR filter is in the camera assembly) may be utilized. However, the light source may be chosen to have wavelengths in the 600 nm to 900 nm range thus reducing number of wavelengths simultaneously having constructive interference effects. For example, a CMOS type camera with IR band pass filter having a sensing range of 400 nm to 850 nm may be utilized with a NIR LED type light source having an output range of 775 nm to 900 nm. In another example, a CMOS type camera having a sensing range of 400 nm to 850 nm may be utilized with an amber LED type light source having an output range of 500 nm to 800 nm. In this manner, light source chosen may be limited to a light source that provides light only at an upper range of the capabilities of the camera. In one example, the light source may operate at the upper 50% of the camera range, and in another example more preferably in the upper 20% range of the camera. Thus, a light source may be chosen that provides a range of wavelengths of light that is smaller than the range the camera is capable of sensing. More importantly, the light wavelengths are provided at an upper end of the camera sensing capabilities.

Second Embodiment

Camera Sensor Optimization for Given Light Source

In a second embodiment, the camera and the light source may be co-optimized. It is noted that CMOS/CCD cameras are relatively inexpensive and prevalent digital camera technology of the visible spectrum. However, CMOS/CCD cameras absorption capabilities often extend into the NIR (often to approximately 1050 nm). It is noted that the near infrared spectrum may be characterized by wavelengths of approximately 700 nm to 1400 nm. Many camera manufacturers however include a short pass filter into the camera assembly to cut the IR light allowed into the camera to prevent IR noise from affecting the visible spectrum picture fidelity. For spin coating analysis, significant benefit is found by using a camera without the NIR filter and matching the camera with a NIR light source. Similarly, using a SWIR (often characterized as wavelengths of approximately 1400 nm to 3000 nm) light source and matching it with a SWIR camera (for example an Indium Gallium Arsenide (InGaAs) based camera) could have similar benefit. Thus, the benefits discussed above regarding the first embodiment may be extended by utilizing cameras that are not limited by filters to exclude longer wavelengths and correspondingly using light sources that have the longer wavelengths in question. In this manner, the light source and the camera utilized may be optimized together to provide a system of providing longer wavelengths and detecting those longer wavelengths, again thus minimizing greater interference effects that may occur with shorter wavelengths.

Third Embodiment

Filtering of Light

In a third embodiment, the spectral range of the light may be limited by the use of filters. As noted above, it is desirable to limit the instances in which multiple wavelengths are constructively interfering simultaneously because limiting such instances provides a better signal quality to the color (or intensity) oscillation seen by the optical sensor (in this example a camera). Thus, limiting the spectral range of the light utilized in the system may limit the number of wavelengths which are constructively interfering and therefore provide improved signal results. Therefore filters may be used that are tailored to cut the spectral range of our light source. The light filtering may be accomplished through a variety of types of filters including short pass filters, long pass filters, or band pass filters. The filter can be incorporated into the optical light path in a variety of places within the system. In one example, the filter may be located between the light source and substrate. In another example, the filter may be located between the substrate and the sensor. In such a case, it may be desirable to locate the filter in front of (or in close proximity to) the sensor as the exemplary example. The smallest spectral range that still allows a viable absorption signal to be detected and discerned by the sensor may be optimal. For example, in one embodiment, filtering may be performed to a wavelength range of 40 nm, even more narrowly to a wavelength range of 10 nm range, and even more preferred to a wavelength range of 5 nm.

Absorption properties of the material itself can also impact which wavelengths that can viably be used. Thus, an alternative embodiment of the spectral range/light source co-optimization involves the pairing of an initially broadband light source with a spectral filter wheel. The spectral filter wheel can provide a variety of filters that can be rotated into the optical path depending upon the desired filtering most suitable for the particular film coating material and underlying substrate combination. In one embodiment, the filter wheel may include a plurality of band pass filters. In this manner a common hardware setup may be provided that allows the selection of an optimum spectral band for a variety of different material absorption properties which may be encountered during the use of the system. Such a system provides process flexibility. Further, the choice of any given spectral filter may be incorporating into the spin coating recipe for a particular coating material at a particular point of the substrate process flow. Thus for example, a broadband light source may be utilized in conjunction with a filter wheel that has band pass filters of passing 650 nm to 690 nm with a first filter, 710 nm to 750 nm with a second filter, 770 nm to 810 nm in a third filter, and 830 nm to 870 nm in a fourth filter. The band pass ranges are merely exemplary however. Further, the band pass range utilized may be dependent upon the film thicknesses being monitored (higher thickness may require narrower ranges for the band pass).

An another alternative use of a spectral filter wheel concept would be a series of band pass filters centered around the same wavelength (for example a 40 nm band pass filter, a 20 nm band pass filter, 10 nm band pass filter, and a 5 nm band pass filter, all the filters centered around the same wavelength, for example 850 nm. Such a filter wheel may be utilized to address differing film thicknesses. One may use the lowest spectral range required for the signal (thicker films using more aggressive narrower band pass filters and thinner films using less aggressive wider band pass filters, if any at all. However, using smaller ranged band pass filters limits the amount of light into camera system. Thus using a 5 nm band pass filter exclusively may make use of that video for general reviewing purposes nearly impossible without an exceptionally bright light source. Thus, one may inset a blank non-filtered section into filter wheel. One such use of a non-filtered section may be when using a very thick film that needs 5 nm band pass filter to see the signal. In such case, the filter wheel may oscillate between the 5 nm band pass filter and the blank at half frequency of camera to have useful frames (the blank filtered every other frame) for general review of processing conditions as well as still have the band pass signal available for film thickness monitoring (by using the filtered frames). It will be recognized that providing four selectable filters is merely exemplary and the system may be configured to allow for more or less filters. Likewise, the use of a filter wheel is merely exemplary and other mechanisms may be utilized to selectively place a differing filter within the optical path between the light source and the optical sensor as the techniques described are not limited to the use of a wheel.

Fourth Embodiment

Orientation of the Light Source and the Camera

Figure 5:
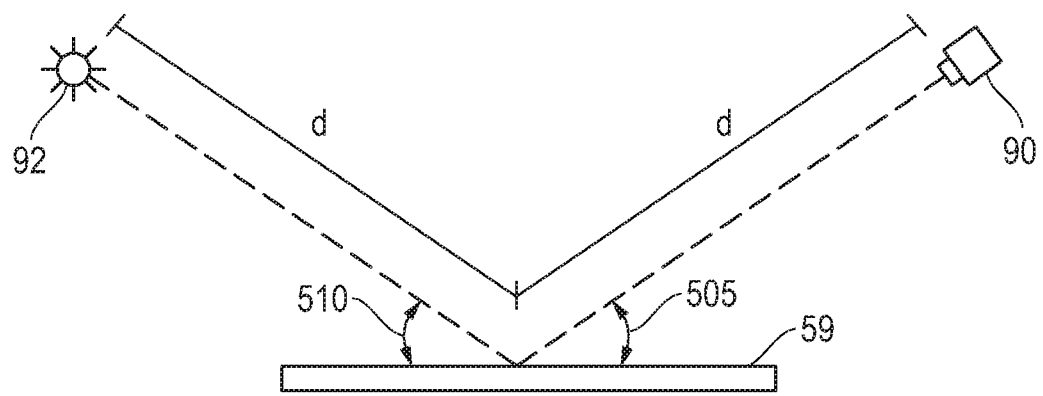
FIG. 5 illustrates a physical placement relationship of a light source, camera and substrate.
Figure 6:
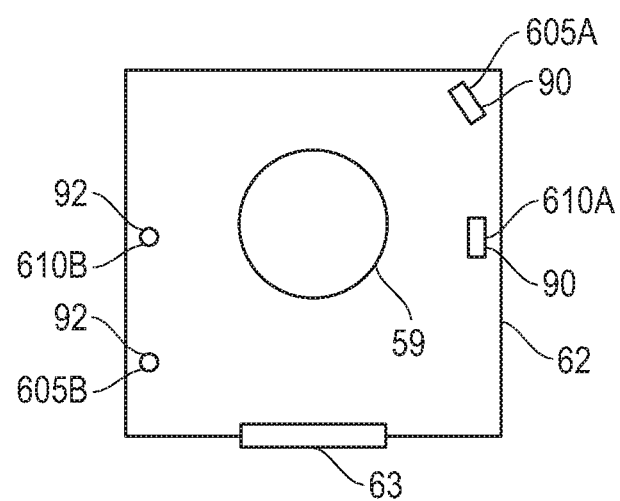
FIG. 6 illustrates alternative placements of a camera and light source.

In a fourth embodiment, the physical location of the light source and camera are optimized together. More specifically, as a reflectivity signal is being collected, the reflectivity signal strength may be maximized by ensuring the $0^{th}$ order reflection of the light source off the substrate is being collected into the optical sensor (for example a camera). Doing this also mitigates other effects, which are experienced in other sensor/light source orientation relationships such as light diffraction effects from underlying highly reflective gratings. To ensure and maximize the reflectivity signal, the physical locations of the light source and camera may be adjusted. Specifically, it may be desirable to 1) maintain a similar angle to a reference plane (that is parallel to the substrate plane) of the light source and the optical sensor, 2) maintain a similar distance relationship of the light source to the center of substrate and the center of substrate to optical sensor and 3) to have the optical sensor positioned 180 degrees diagonally across from light source. Exemplary locations illustrating these concepts are shown in FIGS. 5 and 6. As shown in FIG. 5, a light source 92 and camera 90 are placed with reference to a substrate 59. The locations of the light source 92 and camera 90 may be chosen so that the angle of incidence 505 and angle of incidence 510 of the figure are similar. In one embodiment, the angles of incidence are within 20 degrees of each other, in a more preferred embodiment within 10 degrees, and in an even more preferred embodiment are approximately the same. Further, the distance from the light source 92 to the center of the substrate 59 may be d, and the distance from the camera 90 to the center of the substrate 59 may be the same distance d as shown in FIG. 5. In one embodiment, the distances may be within 10% of each other and in another embodiment 5% and in a more preferred embodiment substantially the same.

Further, as shown in FIG. 6 it may be desirable to have the light source 92 and camera 90 located across from each other. In one embodiment, the light source 92 and camera 90 are substantially 180 degrees diagonal from each other, and in another embodiment located within 10 degrees of being 180 degrees diagonal from each other and in another embodiment within 20 degrees of being 180 degrees diagonal from each other. It is noted that the closer to being 180 degrees diagonal generally provides improved results. FIG. 6 illustrates two exemplary pairings of locations providing for such diagonal relationship. For example, the camera 90 may be placed at location 605A and the light source 92 may be placed at location 605B. This pairing of locations provides the desired 180 degree relationship. Likewise, alternative locations 610A and 6106 may be chosen for the light source 92 and camera 90.

It will be recognized that the arrangements of FIGS. 5 and 6 are merely exemplary locations to provide the angle and distance benefits described above and other locations may be chosen to achieve the same angle and distance results.

Fifth Embodiment

Pixel Selection

A fifth embodiment relates to the selection of the pixels from which data is collected in a frame of the substrate. For example, all pixels that represent the substrate may be used for the benefit of pixel averaging out any small differences in pixel absorption properties of the camera as well as sources of image noise (vibration, moving arms, slight changes of light source intensity, outside coat cup light environment, etc.). However, inclusion of sources of image noise might not be desirable. Also, use of all pixels would include pixels that represent non $0^{th}$ order reflections. However, use of only a subset of pixels may address these issues and provide more accurate data. For example, if the light source/light spectral range is not well aligned with camera absorption properties (e.g. the spectral tail of light source is the only thing that is being absorbed by camera) then averaging all of the pixels from a substrate leads to a loss of signal. One way to address this issue and to regain the signal is to limit the pixels selected to only those pixels in and/or in close proximity to the observable primary reflection of the light source in the camera frame. Such pixels in and/or in close proximity to the observable primary reflection of the light source in the camera frame represent the pixels that are most representing the $0^{th}$ order reflection of our light source. Similarly, selecting only a subset of pixels may allow for the exclusion of regional based noise sources. Thus, use of a selected subset of pixels may provide an improved signal from which data regarding the conditions on the substrate may be extracted. The size of area that the subset of pixels may be limited to may be highly dependent upon the light source and camera combination utilized.

Figure 7:
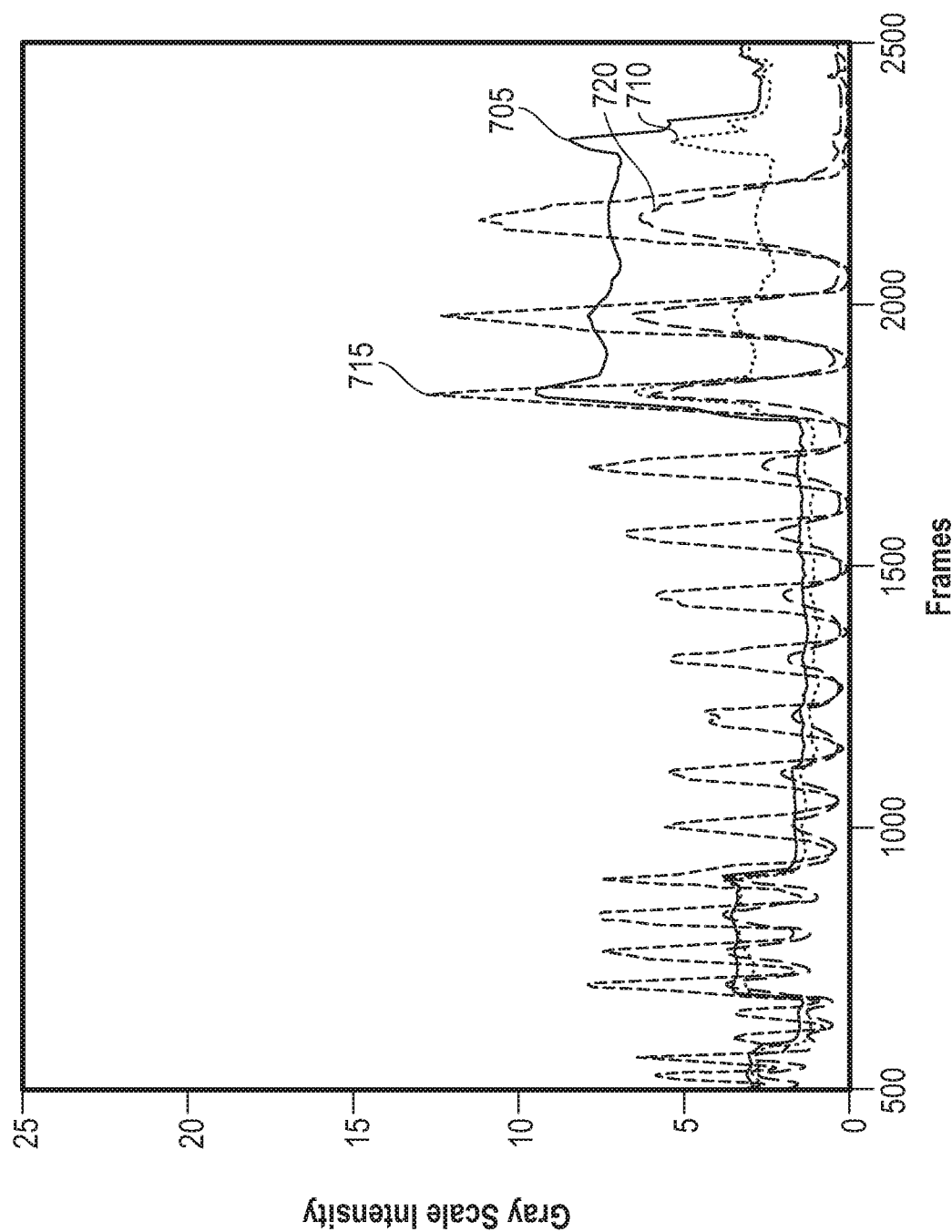
FIG. 7 illustrates plots of a reflectivity intensity versus frames for differing selections of pixels.

FIG. 7 illustrates exemplary effects of selecting only a subset of pixels for analysis. As shown in FIG. 7, plots of the average gray scale intensity (after removing the average frame from shortly after dispense start to end of processing) for a series of frames that are obtained over time from the camera data (thus, the x-axis being collected over time). Plot 705 represents the intensity obtained over the entire collected image from the camera. Plot 710 represents the intensity obtained when the data is limited to a region that corresponds to the substrate. It can be seen that for both of these plots, noise sources and the wide range of the reflections provide large areas of noise where the signal loses its cyclical nature over many frames. Plot 715 and Plot 720 are plots in which only a subset of pixels of the substrate are analyzed. The size of area from which the subset of pixels may be limited to may be highly dependent upon the light source and camera combination utilized. For example, when using an IR LED light source at 850 nm and a first camera with an integrated IR filter, extreme pixel masking to narrowly select the location of reflection on the light source may be desirable, for example limiting the pixels to 10% or even 5% or less of the pixels that correspond to the substrate area. However, in another embodiment utilizing different camera (CMOS camera) without an IR band pass filter and an IR LED source at 850 nm, pixel masking may not be to the same level as the prior example to provide a determination of the reflected signal (though masking may still increase the amplitude of the detected signal). For example, pixel masking of only approximately half the pixels that correspond to the substrate area may be utilized. As seen from the plots, the use of a subset of pixels provides a signal with better noise characteristics.

Sixth Embodiment

Camera Frame Rate and Substrate Rotational Speed

In a sixth embodiment, problems caused by underlying patterns on the substrate being coated are addressed. For example, underlying reflective surfaces may create significant diffraction effects as the pattern rotates during the coating process. Thus, an ever changing underlying pattern is seen by the camera. These diffraction effects may limit the ability to observe the characteristics of the film being coated. More specifically, the diffraction effects (from the underlying pattern) are changing with each frame of the camera because the relationship of the light source to the orientation of the grating inducing the diffraction effects is changing with each frame. In this case it will be difficult to know if a change in a pixel is due to the change in thickness of the coated material or the change in diffraction effect due to the change in substrate orientation. FIGS. 8A-8C illustrate this problem. FIG. 8A illustrates a first frame of camera data for a substrate 805 and the first portion 810 of the substrate 805 for which pixel data is collected in the first frame. Due to the rotation of the substrate 805, in the second frame of camera data, the pixel data collected corresponds to a second portion 815 of the substrate 805. Similarly, in the third frame of camera data, the pixel data collected corresponds to a third portion 820 of the substrate 805. Thus, the collected pixel data will represent differing orientations of the underlying pattern on the substrate 805.

According to this sixth embodiment, the technique disclosed herein matches the frame rate (or a multiple of the frame rate) of the camera to the RPMs of the coat process. By synchronizing this relationship, the camera will be looking at the same orientation of the substrate in each frame being captured by the camera. Therefore, even though diffraction is still induced by the grating, it is consistent frame to frame and thus can be subtracted to see the underlying reflectivity signal related to thickness changing. In one embodiment, the sampling rate of the optical sensor and the spin rate of the substrate are synchronized within 5%, in another embodiment within 1% and in a more preferred embodiment are substantially the same. While this embodiment discusses frame rate optimization relative to a camera system, similar sampling frequency optimization could be employed for other sensor methods. Thus, it will be recognized that though described with regard to frames of a camera, the correlation of the sampling rate of the optical sensor to the rotational spin rate of the substrate may be performed for any optical sensor. FIGS. 9A-9C illustrate the impact of matching the sensor sampling rate to the rotational speed of the substrate. More specifically, FIG. 9A illustrates a first frame, FIG. 9B illustrates a second frame, and FIG. 9C represents a third frame. Due to the matching of the camera frame rate and the rotational spin rate of the substrate, the selected pixels of the substrate are a same common portion 825 of the substrate 805.

It will be recognized that the substrates described herein may be any substrate for which the substrate processing is desirable. For example, in one embodiment, the substrate may be a semiconductor substrate having one or more semiconductor processing layers (all of which together may comprise the substrate) formed thereon. Thus, in one embodiment, the substrate may be a semiconductor substrate that has been subjected to multiple semiconductor processing steps which yield a wide variety of structures and layers, all of which are known in the substrate processing art, and which may be considered to be part of the substrate. For example, in one embodiment, the substrate may be a semiconductor wafer having one or more semiconductor processing layers formed thereon. Although the concepts disclosed herein may be utilized at any stage of the substrate process flow, the monitoring techniques described herein may generally be performed before, during or after a substrate is subject to a fluid dispense operation.

FIGS. 10-15 illustrate exemplary methods for use of some of the processing techniques described herein. It will be recognized that the embodiments of FIGS. 10-15 are merely exemplary and additional methods may utilize the techniques described herein. Further, additional processing steps may be added to the methods shown in the FIGS. 10-15 as the steps described are not intended to be exclusive. Moreover, the order of the steps is not limited to the order shown in the figures as different orders may occur and/or various steps may be performed in combination or at the same time.

Figure 10:
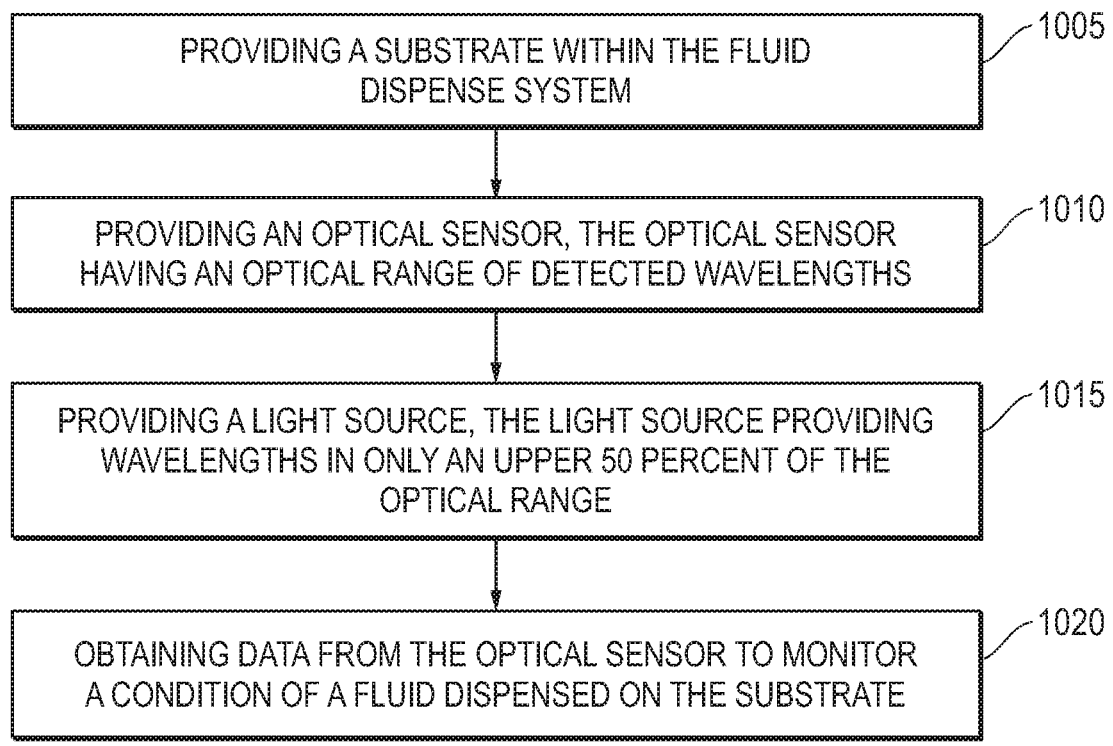
FIGS. 10-15 illustrate methods for utilizing exemplary embodiments of the techniques described herein.

FIG. 10 illustrates an exemplary method of monitoring one or more characteristics of a fluid dispense system. The method comprises step 1005 of providing a substrate within the fluid dispense system; step 1010 of providing an optical sensor, the optical sensor having an optical range of detected wavelengths; step 1015 of providing a light source, the light source providing wavelengths in only an upper 50 percent of the optical range; and step 1020 of obtaining data from the optical sensor to monitor a condition of a fluid dispensed on the substrate.

Figure 11:
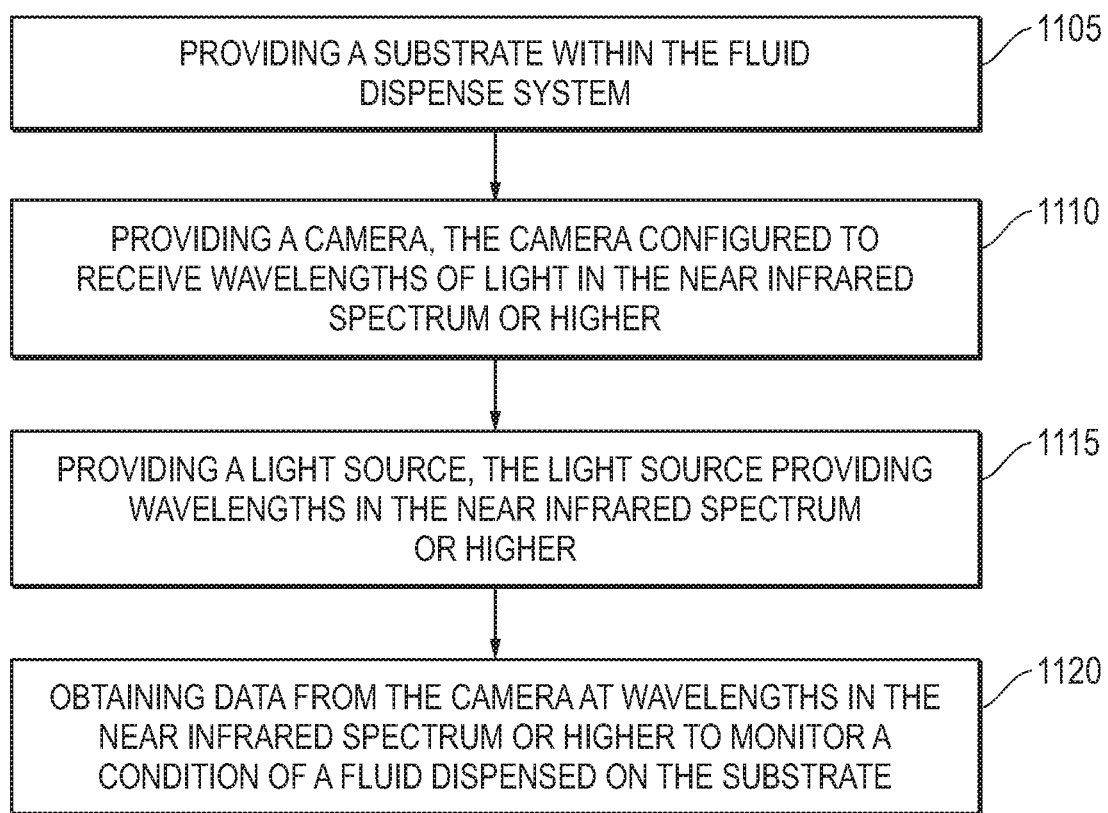

FIG. 11 illustrates an exemplary method of monitoring one or more characteristics of a fluid dispense system. The method comprises step 1105 of providing a substrate within the fluid dispense system; step 1110 of providing a camera, the camera configured to receive wavelengths of light in the near infrared spectrum or higher; step 1115 of providing a light source, the light source providing wavelengths in the near infrared spectrum or higher; and step 1120 of obtaining data from the camera at wavelengths in the near infrared spectrum or higher to monitor a condition of a fluid dispensed on the substrate.

Figure 12:
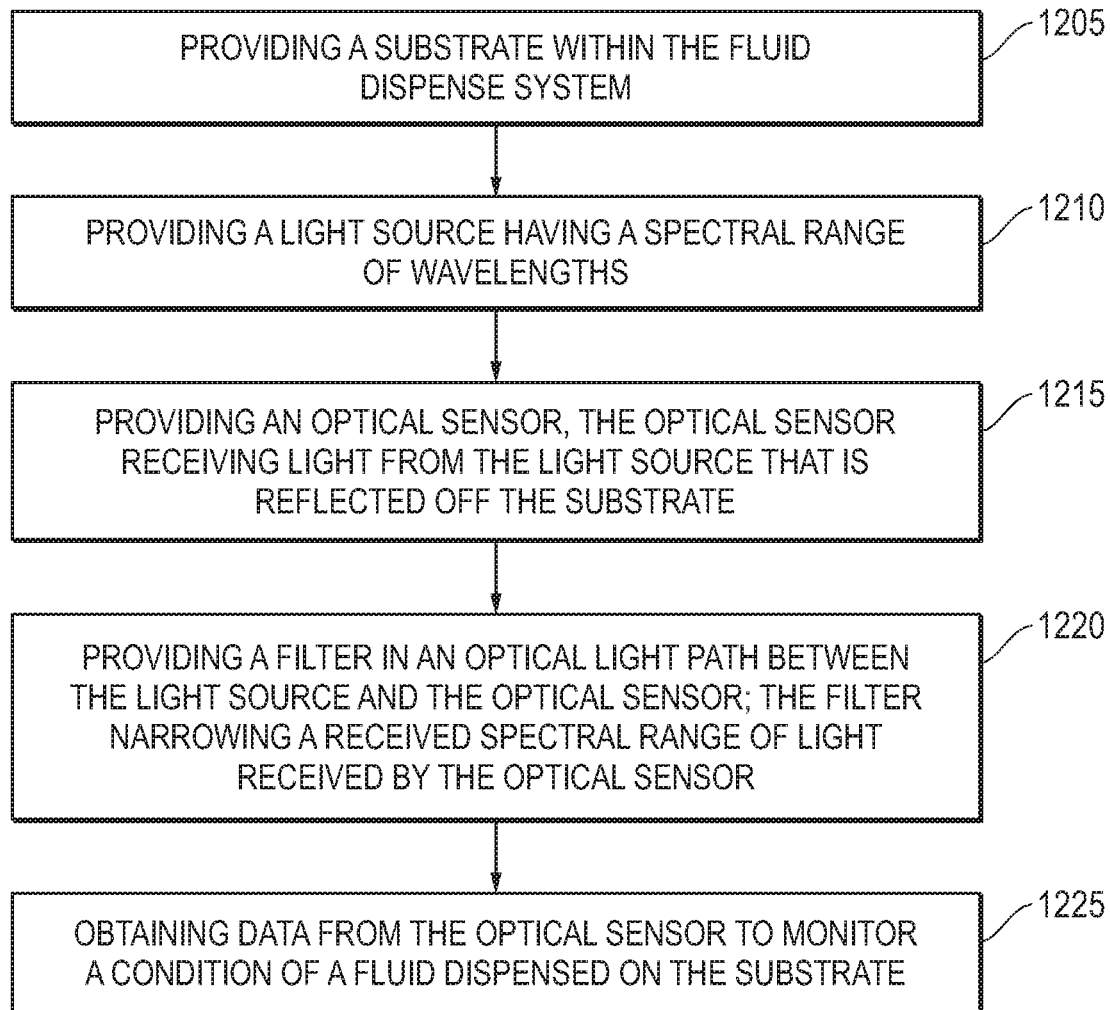

FIG. 12 illustrates an exemplary method of monitoring one or more characteristics of a fluid dispense system. The method comprises step 1205 of providing a substrate within the fluid dispense system; step 1210 of providing a light source having a spectral range of wavelengths; step 1215 of providing an optical sensor, the optical sensor receiving light from the light source that is reflected off the substrate; step 1220 of providing a filter in an optical light path between the light source and the optical sensor; the filter narrowing a received spectral range of light received by the optical sensor; and step 1225 of obtaining data from the optical sensor to monitor a condition of a fluid dispensed on the substrate.

Figure 13:
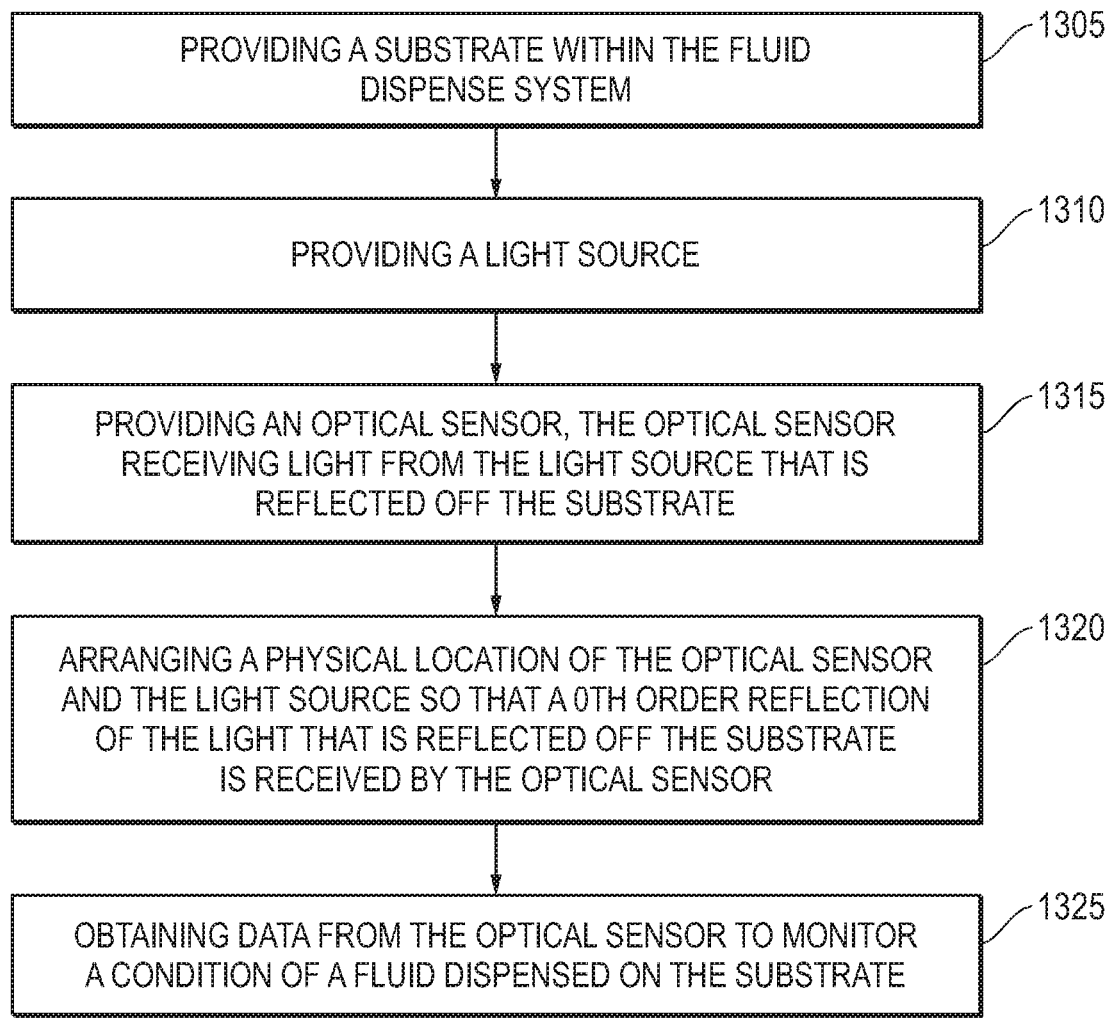

FIG. 13 illustrates an exemplary method of monitoring one or more characteristics of a fluid dispense system. The method comprises step 1305 of providing a substrate within the fluid dispense system; step 1310 of providing a light source; step 1315 of providing an optical sensor, the optical sensor receiving light from the light source that is reflected off the substrate; step 1320 of arranging a physical location of the optical sensor and the light source so that a $0^{th}$ order reflection of the light that is reflected off the substrate is received by the optical sensor; and step 1325 of obtaining data from the optical sensor to monitor a condition of a fluid dispensed on the substrate.

Figure 14:
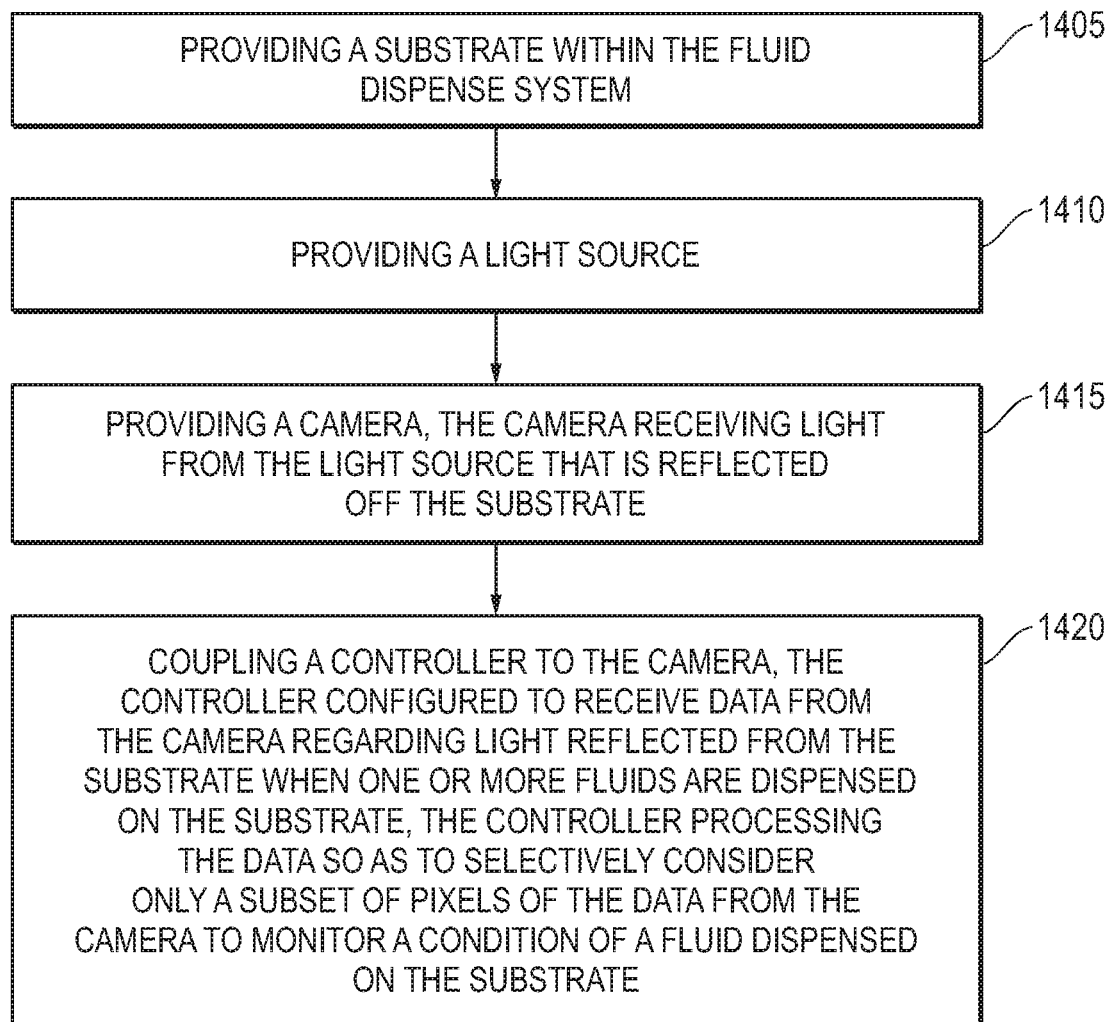

FIG. 14 illustrates an exemplary method of monitoring one or more characteristics of a fluid dispense system. The method comprise step 1405 of providing a substrate within the fluid dispense system; step 1410 of providing a light source; step 1415 of providing a camera, the camera receiving light from the light source that is reflected off the substrate; and step 1420 of coupling a controller to the camera, the controller configured to receive data from the camera regarding light reflected from the substrate when one or more fluids are dispensed on the substrate, the controller processing the data so as to selectively consider only a subset of pixels of the data from the camera to monitor a condition of a fluid dispensed on the substrate.

Figure 15:
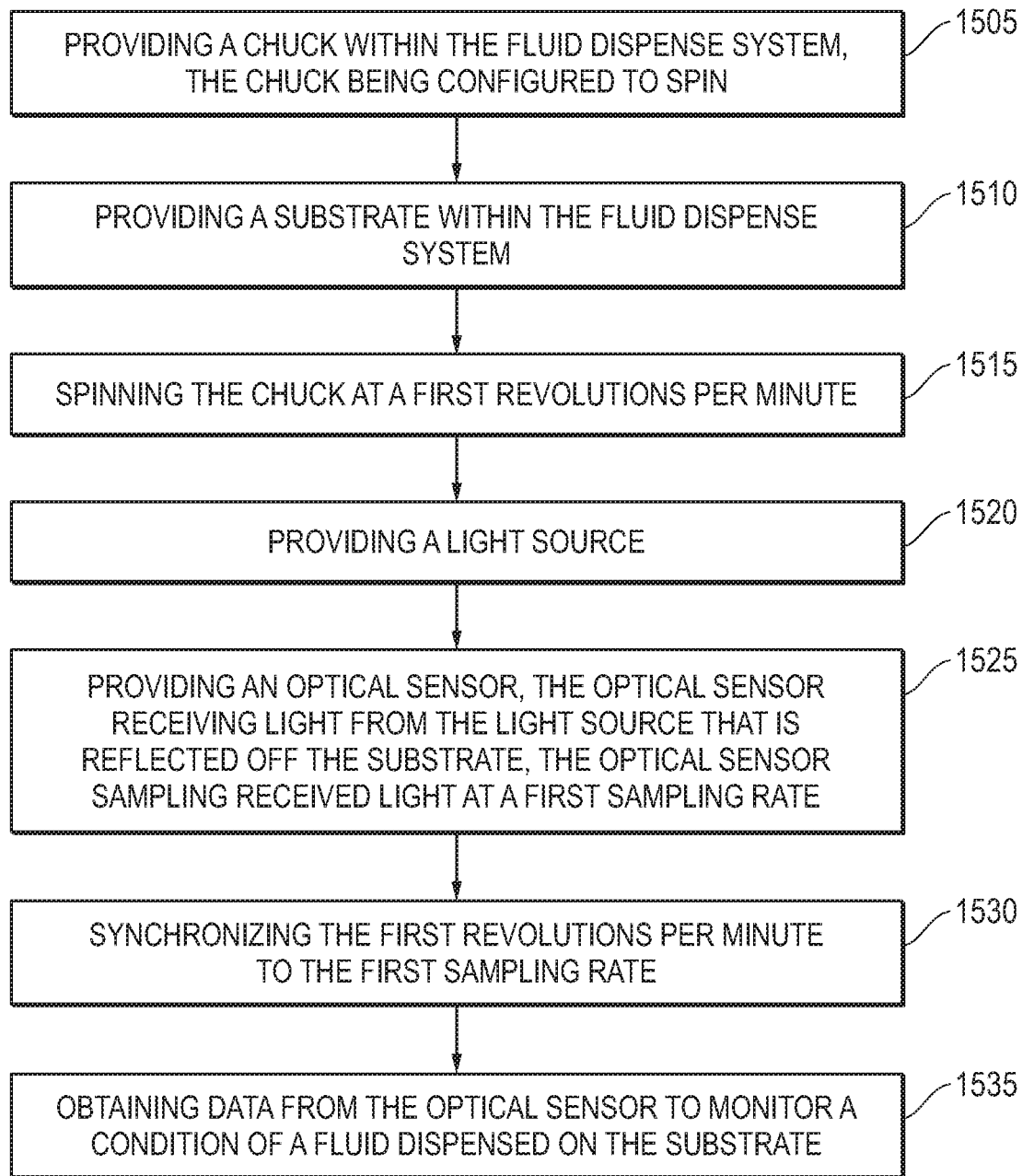

FIG. 15 illustrates an exemplary method of monitoring one or more characteristics of a fluid dispense system. The method may comprise step 1505 of providing a chuck within the fluid dispense system, the chuck being configured to spin; step 1510 of providing a substrate within the fluid dispense system; step 1515 of spinning the chuck at a first revolutions per minute; step 1520 of providing a light source; step 1525 of providing an optical sensor, the optical sensor receiving light from the light source that is reflected off the substrate, the optical sensor sampling received light at a first sampling rate; step 1530 of synchronizing the first revolutions per minute to the first sampling rate; and step 1535 of obtaining data from the optical sensor to monitor a condition of a fluid dispensed on the substrate.

Further modifications and alternative embodiments of the inventions will be apparent to those skilled in the art in view of this description. Accordingly, this description is to be construed as illustrative only and is for the purpose of teaching those skilled in the art the manner of carrying out the inventions. It is to be understood that the forms and method of the inventions herein shown and described are to be taken as presently preferred embodiments. Equivalent techniques may be substituted for those illustrated and described herein and certain features of the inventions may be utilized independently of the use of other features, all as would be apparent to one skilled in the art after having the benefit of this description of the inventions.

What is claimed is:

1. A method of monitoring one or more characteristics of a fluid dispense system, the method comprising:
providing a chuck within the fluid dispense system, the chuck being configured to spin;
providing a substrate within the fluid dispense system;
spinning the chuck at a first revolutions per minute;
providing a light source;
providing an optical sensor, the optical sensor receiving light from the light source that is reflected off the substrate, the optical sensor sampling received light at a first sampling rate;
synchronizing the first revolutions per minute and the first sampling rate; and
obtaining data from the optical sensor to monitor a condition of a fluid dispensed on the substrate.

2. The method of claim 1, wherein the optical sensor is a camera.

3. The method of claim 2, wherein the camera is a video camera.

4. The method of claim 2, wherein the synchronizing of the first revolutions per minute and the first sampling rate provides for a plurality of frames of data to be collected by the camera so that the substrate is in a same rotational orientation for each of the plurality of frames.

5. The method of claim 4, wherein synchronizing the first revolutions per minute and the first sampling rate provides consistent diffraction effects frame to frame.

6. The method of claim 5, further comprising subtracting the consistent diffraction effects to analyze an underlying reflectivity signal.

7. The method of claim 6, wherein analysis of the underlying reflectivity signal provides fluid thickness information.

8. The method of claim 1, wherein the synchronizing of the first revolutions per minute and the first sampling rate provides for a plurality of sets of data to be collected by the optical sensor so that the substrate is in a same rotational orientation for each of the plurality of sets of data.

9. The method of claim 8, wherein synchronizing the first revolutions per minute and the first sampling rate provides consistent diffraction effects between data set to data set.

10. The method of claim 9, further comprising subtracting the consistent diffraction effects to analyze an underlying reflectivity signal, wherein analysis of the underlying reflectivity signal provides fluid thickness information.

11. The method of claim 1, wherein the sampling rate of the optical sensor and the spin rate of the substrate are synchronized within 5%.

12. The method of claim 1, wherein the sampling rate of the optical sensor and the spin rate of the substrate are synchronized within 1%.

13. A fluid dispense system for coating a film on a substrate, the fluid dispense system comprising:
    a spin chuck capable of holding the substrate;
    a nozzle capable of dispensing one or more fluids onto the substrate;
    an optical sensor;
    a light source; and
    one or more controllers coupled to the optical sensor and the spin chuck, the one or more controllers configured to synchronize a rate of spinning of the spin chuck and a sampling rate of the optical sensor,
    wherein at least one of the one or more controllers is configured to receive data from the optical sensor regarding light reflected from the substrate when the one or more fluids are dispensed on the substrate.

14. The fluid dispense system of claim 13, wherein the optical sensor is a camera.

15. The fluid dispense system of claim 14, wherein the synchronizing of the rate of spinning of the spin chuck and the sampling rate provides for a plurality of frames of data to be collected by the camera so that the substrate is in a same rotational orientation for each of the plurality of frames.

16. The fluid dispense system of claim 15, wherein the one or more controllers is configured to subtract the diffraction effects to analyze an underlying reflectivity signal, wherein analysis of the underlying reflectivity signal provides fluid thickness information.

17. The fluid dispense system of claim 15, wherein the sampling rate of the optical sensor and the spin rate of the substrate are synchronized within 5%.

18. The fluid dispense system of claim 13, wherein the sampling rate of the optical sensor and the spin rate of the substrate are synchronized within 5%.

19. The fluid dispense system of claim 18, wherein the optical sensor is a video camera.

20. The fluid dispense system of claim 13, wherein the sampling rate of the optical sensor and the spin rate of the substrate are synchronized within 1%.

* * * * *